United States Patent [19]

Howard

[11] Patent Number: 4,868,836
[45] Date of Patent: Sep. 19, 1989

[54] LASER DIODE POWER CONTROL AND MODULATOR CIRCUIT

[75] Inventor: P. Guy Howard, Junction City, Oreg.

[73] Assignee: Spectra-Physics, Inc., San Jose, Calif.

[21] Appl. No.: 834,285

[22] Filed: Feb. 27, 1986

[51] Int. Cl.$^4$ .............................................. H01S 3/00
[52] U.S. Cl. ...................................... 372/38; 372/26; 372/29
[58] Field of Search ...................... 372/26, 29, 31, 32, 372/38; 250/205

[56] References Cited

U.S. PATENT DOCUMENTS 3,898,583  8/1975  Shuey .................................... 372/38

Primary Examiner—William L. Sikes
Assistant Examiner—B. R. R. Holloway
Attorney, Agent, or Firm—Donald C. Feix; T. M. Freiburger; Paul Davis

[57] ABSTRACT

A control system particularly for a modulated laser diode such as for use in laser printers, laser communication systems, optical data storage and other uses employs bipolar integrated circuitry on a single chip with very few external components. The circuit is simple and of low cost and dependable construction and compensates for relatively slow changes in the output characteristics of the laser diode as caused by aging, temperature changes or other varying conditions. The drift compensation is accomplished through current differencing and combining a current difference signal with a modulation input signal to drive the laser diode.

4 Claims, 1 Drawing Sheet

U.S. Patent    Sep. 19, 1989    4,868,836
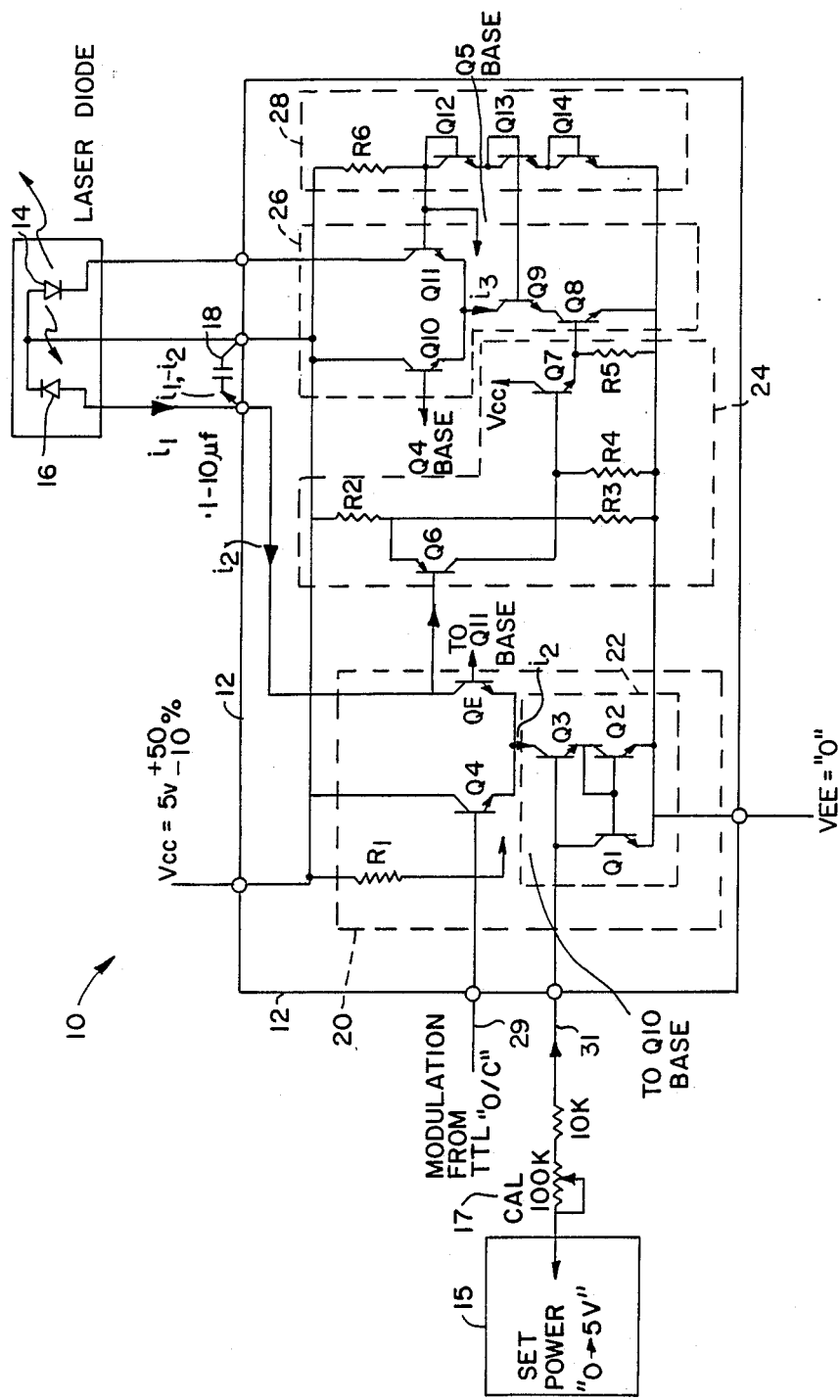

LASER DIODE POWER CONTROL AND MODULATOR CIRCUIT

BACKGROUND OF THE INVENTION

The invention relates to a control system for controlling the power output of a laser diode.

More specifically, the invention relates to an integrated circuit of highly efficient construction which also compensates for slow changes in the output power vs. current characteristic of the laser diode. The circuit is particularly useful where the laser diode is modulated.

In laser printers, laser optical data storage systems, laser communication systems and other systems wherein a laser diode is employed, relatively slow changes occur in the output power vs. current characteristic of the laser diode. These can be caused by aging, varying temperature, or other changes in the diode's environment, or other factors. In a modulated laser diode the changes sometimes occur more rapidly or acutely, due to the repeated temperature changes related to the modulation pattern.

For dependable and continued accurate operation of the laser diode, there must be compensation for the relatively slow changes which affect output power.

Prior systems have included relatively complex circuitry for detecting and compensating for differences between actual diode output power and desired output power levels. The prior systems, which included feedback loops, often used voltage comparisons for determining and controlling drifts in power output, and this necessarily made the systems more complex and made it difficult to obtain a frequency response which would enable a faithful feedback signal.

None of the prior control systems was capable of dependably and accurately compensating for relatively slow drifts in a laser diode's output power vs. current characteristic utilizing simple bipolar circuitry included on a chip with very few external components, as in the present invention described below.

SUMMARY OF THE INVENTION

In accordance with this invention, a power control circuit receives a sense signal from a sense diode monitoring the laser diode's output. The circuit compares the sense signal with a reference to constantly monitor the output vs. current characteristic of the laser diode. In a preferred embodiment the sense signal is compared with a modulation input signal, for modulated output of the laser diode. A comparison means associated with the sense diode and the modulation input signal compares the signal from the sense diode with the modulation signal and generates an error signal representing the magnitude of the difference between the laser diode's output and the desired output. The differencing is accomplished by subtracting currents.

An integration means extracts a slowly changing error signal to represent gradual drifts in the laser diode's output power vs. current characteristic, and it generates a compensating current bias signal. The bias signal is used to bias the current to the laser diode in accordance with and in compensation for such slow drifts in the output power vs. current characteristic. Preferably it is combined with the modulation current signal to affect current driving the laser diode.

In a preferred embodiment of the invention, the circuit is all contained in a single chip, with the exception of a set power supply and calibration means and one additional external component.

It is an important objective of the invention to have a laser diode modulation control circuit with a very low impedance load for a monitoring sense diode, to minimize frequency response limitations imposed by internal capacitance.

Another object is to have a slow control loop to compensate for slowly changing laser diode characteristics, with the loop utilizing simple and inexpensive components, preferably bipolar circuitry, without the need for very high frequency response.

A related objective of the invention is to be able to implement the control circuit as a single integrated circuit using readily available semi custom or custom bipolar circuitry and a minimum number of external components, most notably one capacitor.

Another related object is to establish the control circuit such that the internal capacitance of the sense diode has minimal effect on the frequency response of the entire circuit, resulting in a faithful feedback signal.

Another important feature is that the circuit of the invention uses emitter-coupled logic, having good high frequency response, and employs a current mirror, for very high stability of operation, particularly over a wide temperature range.

Other and further objects of the present invention will be apparent from the following description and claims and are illustrated in the accompanying drawings which, by way of illustration, show preferred embodiments of the present invention and the principles thereof and what are now considered to be the best modes contemplated for applying these principles. Other embodiments of the invention embodying the same or equivalent principles may be used and structural changes may be made as desired by those skilled in the art without departing from the ; present invention and the purview of the appended claims.

DESCRIPTION OF THE DRAWING

FIG. 1 is a schematic circuit diagram indicating a laser diode modulation and power monitoring circuit in accordance with a preferred embodiment of the invention, for controlling the power output of a modulated laser diode and sensing and compensating for relatively slow changes in the output power vs. current characteristic of the laser diode.

DESCRIPTION OF A PREFERRED EMBODIMENT

FIG. 1 shows a laser diode control circuit in accordance with the principles of the invention, generally identified by the reference number 10. The circuit 10 preferably is implemented almost entirely in a single integrated circuit, on a chip indicated by the rectangle of boundary lines 12 in FIG. 1.

Although the circuit in general terms can be used for either continuous wave or modulated laser diode control, it is shown in this preferred embodiment as a control for a modulated laser diode.

In addition to the integrated circuit or chip 12, FIG. 1 shows that the circuit is connected to a laser diode 14 for producing a modulated laser beam output and to a detector diode or sense diode 16 which monitors the intensity of the beam output of the diode 14 for providing a feedback signal. The circuit 10 includes a single external component in this preferred embodiment comprising a capacitor 18, all the remaining control circuitry being implemented in the chip 12 with the exception of a set power supply 15, and a calibration device 17 which may be a potentometer.

As shown in the drawing, the circuit 10 can be divided into different stages or major components as follows: a bias generating stage shown enclosed by a dashed line 20; a current mirror enclosed by another dashed line 22 within the bias generating stage 20; a DC amplifier/level translator stage 24; a laser diode drive stage 26; a DC voltage reference 28; and the external capacitor 18.

The bias generating stage 20 receives as inputs a modulation signal 29 which goes to the base of Q4, a set power reference signal from the unit 15 via 17 which goes into the current mirror stage 22, a feedback signal 33 (a current $i_1$) from the sense diode 16 and input power $V_{CC}$ which is common to all of the amplification stages. An output signal from the current mirror 22 from the collector of Q5 goes to the base of Q6 and to the amplifier stage 24.

The set power reference signal 31 is adjusted generally only once, for initial calibration of the diode 14 to the desired output level.

If the circuit 10 is to be used for control of a laser diode in a continuous wave mode, rather than modulation mode as shown, the modulation input line 29 would be connected to the $V_{EE}$ terminal.

Transistors Q4 and Q5 of the bias generating stage 20 comprise a conventional differential amplifier circuit whose emitters are coupled and which sink a constant current $i_2$ emanating from the current mirror stage 22. This current mirror stage reflects as a sink current. The sink current $i_2$ leaving the emitters Q4 and Q5 is equal to the driving set current 31 or reference signal entering the current mirror. As is well known, this is a property that basically defines a current mirror, where an input current creates an equal sink current which is a constant current source.

Although Q4 and Q5 are configured in a voltage difference amplifier, both Q4 and Q5 operate in the saturated mode, that is, Q4 is either fully turned on or fully turned off and the same is true for Q5. As a result, the current leaving Q5's collector branches to the base of Q6 and also to the sense diode 16, such that the drive current at Q6 equals the difference between the amount of current $i_2$ deliverable by the current mirror 22 and the amount of current that can flow in the sense diode 16. The sense diode 16 is connected in a reverse configuration and has the property that its output current will be proportional to the radiated energy shining on it. Therefore since Q5 is in saturation, $i_2$ basically is directed to two places, to whatever the sense diode 16 will support, and to the base of Q6 with what remains.

The drain current on the emitters Q4 and Q5 is a linear current that is equal almost precisely to the set current 31 entering the current mirror from the external set power input. In this way the modulation signal 29 which is basically a digital signal, is superimposed upon the desired set power 31, or $i_2$.

One property of the circuit in this preferred embodiment is that the sense diode 16 directly feeds the capacitor 18, which goes between the one side of the sense diode or the $V_{CC}$ and the collector of Q5. Capacitor 18 thereby serves two functions: it serves as a very low impedance load on the sense diode 16, which has the benefit of overcoming the effects of any internal capacitance of the sense diode, and secondly serves as an integrating capacitor for the differential signal $i_1-i_2$ which emanates from the collector of Q5.

One property of the circuitry leaving the collector of Q5, that is the one branch going to the sense diode 16 and the other branch going to the base of Q6, is that these are current signals as opposed to voltage signals. They work into essentially constant current sources. In this way the use of intervening voltages is minimized and the optimum loading is presented to the sense diode 16.

Proceeding to the next stage, the DC amplifier stage 24, the difference signal $i_1-i_2$ which has been filtered by the capacitor 18, provides a bias current which is amplified by the combination of Q6, Q7 and resistors R2, R3, R4 and R5 to provide at the emitter of Q7 the current drive to the constant current generator source of the final laser diode drive stage 26. The amplification stage 24 serves the function of translating the signal towards the negative supply, and providing gain.

In the laser diode drive stage 26 the current leaving the DC amplifier stage 24 is used to drive a constant current sink for the voltage difference amplifier, in effect an emitter coupled switch amplifier Q10 and Q11. The constant current used to sink Q10 and Q11 is relatively immune to any voltage changes of the external power supply $V_{CC}$ or to temperature changes that might occur in the ambient conditions of the integrated circuit.

The current $i_3$ is superimposed upon the modulation signal which is used to drive the base of Q10 (also connected to the Q4 base). The frequency response of the drive signal to the laser diode 14 is optimized by using emitter coupled circuitry whereby Q10 and Q11 share the same constant current source $i_3$. In this manner the signal used to drive the laser diode is an exact reproduction of the digital signal on the base of Q10.

The output of the collector of the transistor Q11 to the laser diode is one of a switchable constant current source. This ensures that the drive current to the laser diode is independent of the diode's internal resistance and terminal voltage.

Both the bias generating stage 20 and the laser diode drive stage 26 have one of their two emitter coupled transistors referenced to a constant reference voltage provided by DC voltage reference source 28. This reference source is comprised of essentially a series of diodes connected to a resistor between $B+V_{CC}$ and ground. There are various ways that this voltage reference source could be implemented; other implementations could involve zener diodes or diodes and resistors.

In both the bias generating stage 20 and the laser diode drive stage 26 the two emitter coupled transistors Q4 and Q5 in one case and Q10 and Q11 in the other case are acting as switches to divert the constant sink current drained from the emitters through one of the other of the stages.

As can be seen from this overall schematic, all circuitry used consists of bipolar semiconductors and resistors, components that are relatively easy to fabricate using standard custom or semi custom integrated circuit fabrication techniques. It can also be seen that there are a minimum number of external components (as well as internal components). The capacitor 18 is external because of its size.

It can also be seen that the circuitry internal to the chip, owing to its use of current mirrors and digital switching, is extremely stable in the presence of varying power supply voltages $V_{CC}$ and varying chip temperatures due to the external environment.

While I have illustrated and described the preferred embodiments of my invention, it is to be understood that these are capable of variation and modification, and I therefore do not wish to be limited to the precise details set forth, but desire to avail myself of such changes and alterations as fall within the purview of the following claims.

I claim:

1. A single bipolar integrated laser diode power control circuit for use with a laser diode whose light output is monitored by a sense diode, for compensating for relatively slow changes in the laser diode's output power versus current characteristic, comprising, comparison means for comparing a current output signal from the sense diode with a reference signal, and for generating an error signal representing the magnitude of the difference between said laser diode's output and the desired output, integration means for receiving said error signal and generating a slowly changing compensating current bias signal, and amplifier means for amplifying the compensating current bias signal, and power adjustment means for varying current level to the laser diode in compensation for such slow changes in the output power versus current characteristic, with the amplified compensation current bias signal as an input to said power adjustment means, and wherein the circuit includes a reference generating means comprising a current mirror and a current switch which generates the reference signal as a current, and said comparison means including means for comparing the current signal from the sense diode with said reference signal, to generate the error signal solely by means of current differencing.

2. A control circuit in accordance with claim 1, for use with a modulated laser diode, including the pair of emitter coupled switches, both connected to receive a modulation input signal, said current mirror being operatively connected to the first emitter coupled switch to produce said error signal in the form of a difference current signal, an inverting amplifier receiving the difference current signal, and a constant current generator receiving the difference current signal after processing by said integration means.

3. A control circuit in accordance with claim 1, wherein the circuit includes only bipolar components.

4. A single bipolar integrated laser diode power control and modulation circuit for use a modulated laser diode whose light output is monitored by a sense diode, for compensating for relatively slow changes in the laser diode's output power versus current characteristic, comprising, means for receiving a modulation input signal, modulated in accordance with the desired output of the laser diode, comparison means for comparing a signal from the sense diode with a reference signal, and for generating an error signal representing the magnitude of the difference between the laser diode's output and the desired output, integration means for receiving the error signal and generating a slowly changing compensating current bias signal, means for combining the compensating current bias signal with the modulation input signal and accordingly for changing current level to the laser diode in compensation for such slow changes in the output power versus current characteristic, and wherein the signal from the sense diode is a current and wherein the comparison means includes means for comparing the current signal from the sense diode with a current corresponding to the reference signal, to generate the error signal solely by means of current differencing.

* * * * *